US009574436B2

(12) United States Patent
Knight

(10) Patent No.: US 9,574,436 B2
(45) Date of Patent: Feb. 21, 2017

(54) MOUNTING PLATE APPARATUS, SYSTEMS, AND METHODS

(71) Applicant: Halliburton Energy Services, Inc., Houston, TX (US)

(72) Inventor: Sean Paul Knight, Richmond, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 14/771,081

(22) PCT Filed: Oct. 22, 2014

(86) PCT No.: PCT/US2014/061744
§ 371 (c)(1),
(2) Date: Aug. 27, 2015

(87) PCT Pub. No.: WO2016/064382
PCT Pub. Date: Apr. 28, 2016

(65) Prior Publication Data
US 2016/0222776 A1 Aug. 4, 2016

(51) Int. Cl.
*E21B 47/01* (2012.01)
*H01F 27/28* (2006.01)
*H05K 7/20* (2006.01)
*H04L 12/40* (2006.01)
*H05K 1/02* (2006.01)
(Continued)

(52) U.S. Cl.
CPC ............. *E21B 47/01* (2013.01); *E21B 47/011* (2013.01); *H01F 27/28* (2013.01); *H04L 12/40039* (2013.01); *H05K 1/0203* (2013.01); *H05K 7/02* (2013.01); *H05K 7/14* (2013.01)

(58) Field of Classification Search
CPC ...... E21B 47/01; E21B 47/011; H01F 27/281; H05K 1/0203; H05K 7/02; H05K 7/14; H05K 7/2039
See application file for complete search history.

(56) References Cited

U.S. PATENT DOCUMENTS 4,400,858 A * 8/1983 Goiffon ............... E21B 47/011
138/108
5,019,940 A 5/1991 Clemens
(Continued)

FOREIGN PATENT DOCUMENTS

JP 2010080587 A * 4/2010
WO WO-2016/064382 A1 4/2016

OTHER PUBLICATIONS

"International Application Serial No. PCT/US2014/061744, International Search Report mailed Jul. 16, 2015", 3 pgs.
(Continued)

*Primary Examiner* — Robert J Hoffberg

(57) ABSTRACT

In some embodiments, an apparatus and a system may include a substantially flat mounting plate having a first inset portion to receive a circuit board, and a second inset portion to receive an electronic component. A lower level of the second inset portion defines the first end of a post extending in a vertical direction away from the mounting plate to terminate in a second end, and the second end of the post is shaped to receive a fastener. The second end of the post may be used to secure a cap, and thus the electronic component, to the plate. Additional apparatus and systems, as well as methods, are disclosed.

22 Claims, 4 Drawing Sheets

(51) Int. Cl.
*H05K 7/02* (2006.01)
*H05K 7/14* (2006.01)

(56) References Cited

U.S. PATENT DOCUMENTS

| | | | |
|---|---|---|---|
| 5,912,609 A * | 6/1999 | Usui | H01F 27/292 336/192 |
| 5,917,703 A | 6/1999 | Murphy | |
| 6,012,537 A * | 1/2000 | Rountree | E21B 4/02 166/242.1 |
| 6,021,045 A | 2/2000 | Johnson | |
| 6,633,216 B2 | 10/2003 | Lewin et al. | |
| 6,943,455 B1 | 9/2005 | Maxwell | |
| 7,113,405 B2 | 9/2006 | Armstrong | |
| 7,265,985 B2 | 9/2007 | Widmayer et al. | |
| 7,298,622 B2 | 11/2007 | Conner et al. | |
| 7,327,573 B2 | 2/2008 | Lee | |
| 7,363,971 B2 | 4/2008 | Rodney et al. | |
| 7,696,611 B2 | 4/2010 | Deepak et al. | |
| 7,804,172 B2 | 9/2010 | Schultz et al. | |
| 7,969,002 B2 | 6/2011 | Ashrafzadeh et al. | |
| 7,986,529 B2 | 7/2011 | Lee et al. | |
| 8,217,745 B2 * | 7/2012 | Tien | H01F 17/062 336/196 |
| 8,237,252 B2 | 8/2012 | Pagaila et al. | |
| 8,278,568 B2 | 10/2012 | Hardin | |
| 8,409,979 B2 | 4/2013 | Choi et al. | |
| 8,564,092 B2 | 10/2013 | Burgyan et al. | |
| 8,922,988 B2 * | 12/2014 | Swett | H05K 5/0213 361/679.36 |
| 2006/0022788 A1 * | 2/2006 | Sasamori | H01F 17/043 336/208 |
| 2010/0039779 A1 * | 2/2010 | Mitchell | H05K 1/092 361/739 |
| 2011/0017473 A1 | 1/2011 | Clarkson et al. | |
| 2011/0052444 A1 | 3/2011 | Hrametz et al. | |
| 2012/0031669 A1 | 2/2012 | Foster | |
| 2012/0050995 A1 | 3/2012 | Guan | |
| 2013/0068446 A1 | 3/2013 | Yoon | |
| 2014/0062462 A1 | 3/2014 | McChrystal et al. | |
| 2014/0187058 A1 | 7/2014 | Yan et al. | |
| 2014/0284137 A1 | 9/2014 | Rodgers et al. | |
| 2016/0073509 A1 * | 3/2016 | Zhang | H01F 27/022 361/748 |

OTHER PUBLICATIONS

"International Application Serial No. PCT/US2014/061744, Written Opinion mailed Jul. 16, 2015", 6 pgs.

\* cited by examiner

MOUNTING PLATE APPARATUS, SYSTEMS, AND METHODS

PRIORITY APPLICATIONS

This application is a U.S. National Stage Filing under 35 U.S.C. §371 from International Application No. PCT/US2014/061744, filed on 22 Oct. 2014, which application is incorporated herein in its entirety.

BACKGROUND

Understanding the structure and properties of geological formations may reduce the cost of drilling wells for oil and gas exploration. Measurements are typically performed in a borehole (i.e., downhole measurements) in order to attain this understanding. For example, the measurements may identify the composition and distribution of material that surrounds the measurement device downhole.

To obtain such measurements downhole, a variety of electronic assemblies and mounting configurations may be used. However, such assemblies may be sensitive to downhole vibration and temperature conditions, affecting the ability to operate in a reliable fashion.

DETAILED DESCRIPTION

To address some of the challenges described above, as well as others, apparatus, systems, and methods are described herein that may operate to improve the ability of various electronic circuit components to tolerate downhole vibration and temperature conditions. This improvement may, in turn, improve the reliability of services provided to a variety of customers during petroleum recovery operations.

To convey a more consistent use of terminology throughout this document, several specific terms and phrases are used. These are defined below. After this list of definitions has been given, a more detailed description of the mechanisms used in several embodiments will be provided.

a "housing" includes any one or more of a drill collar, a downhole tool, or a wireline logging tool body (all having an outer surface), to enclose or attach to circuit cards, inserts, drivers, amplifiers, sensors, transmitters, receivers, acquisition and processing logic, and data acquisition systems.

an "inset portion" refers to a portion of a substantially flat surface comprising a depression that goes below the surface and is bounded by a supportive floor at the base of the depression. The depression is characterized by at least one wall, which may intersect the floor as a curve, or as a substantially straight line. If the intersection comprises a stepped transition (e.g., the wall forms a substantially straight line), then the intersection can be further defined by the angle between the floor and the wall. If the intersection comprises a curved transition (e.g., the wall forms a curve), then the intersection can be further defined by the type of curve, such as circular, parabolic, or exponential.

Figure 1:
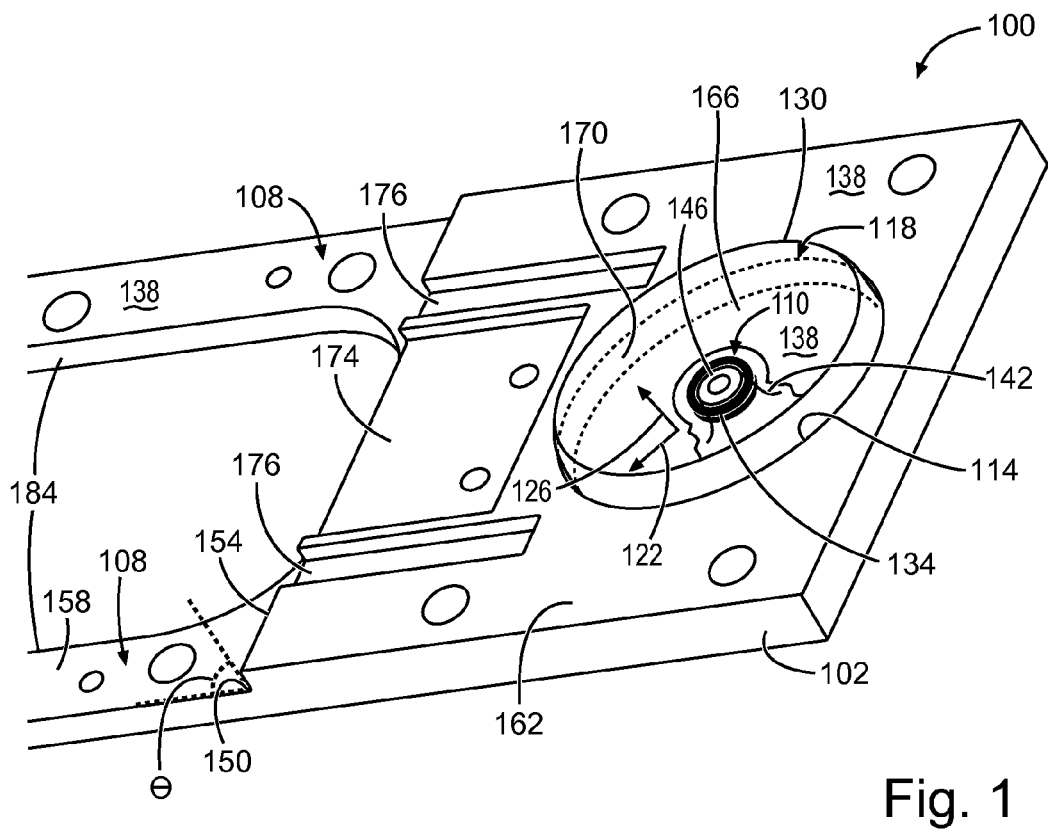
FIG. 1 is a perspective view, looking downward, of a mounting plate apparatus configuration, according to various embodiments.

FIG. 1 is a perspective view, looking downward, of a mounting plate apparatus 100 configuration, according to various embodiments. The apparatus 100 includes a first inset portion 108 (which can be used to receive and attach a circuit board) and a second inset portion 118 (which can be used to attach one or more components 130).

This design improves upon others used to mount components and printed circuit boards to housing inserts in the downhole tool environment because it provides a more stable and durable platform for larger electrical components with respect to vibration. As a result, the apparatus 100 can be used in many situations, such as mounting driver electronics circuit boards to their inserts, including mud pulser circuit board inserts, such as the High Data Rate (HDR) Negative Pulser (NP) Fast Driver Controller (FDC) insert used by Halliburton Energy Services, Inc. of Houston, Tex.

The effects of vibration on larger components can be reduced in a manner that is directly attributable to the structure of the apparatus 100. For example, a post 110 attached at one end to the floor 114 of the inset portion 118, perhaps near the center of the insert portion 118, and extending in a substantially vertical direction with respect to the substantially horizontal plane of the floor 114, can be used to provide secure support for one or more components 130. This support extends in the radial direction 122, outwardly away from the post 110, which has one end defined by the intersection of the post 110 and the floor 114 of the inset portion 118. This security can be enhanced by using a cap (see cap 212 in FIG. 2) that is fastened to the post 110, perhaps using a screw, to secure the component 130 to the plate 102, for support in the axial direction 126.

A cushion 134, perhaps comprising silicone rubber, can be inserted between the component 130 and the post 110 to provide additional resistance to vibration. In one embodiment, an apparatus 100 assembled in this fashion enabled a component 130 (e.g., a toroidal inductor) to pass a 10 g laboratory vibration screening test with ease. Mounting components 130 in this way can also benefit an associated printed circuit board. That is, if the component 130 were mounted directly to the board, instead of to the plate 102, there would be a much greater risk of vibration damage to the board itself, as well as to the component. Either one, or both, might more easily crack or break. Finally, the combination of an inset portion 118 in the plate 102, along with a post 110, a cap (see cap 212 in FIG. 2) and a cushion 134, provide a component preservation system that serves to address space restrictions that may be present in some applications.

Another benefit of the apparatus 100 is the ability to provide an effective heat sink path for the component 130. This can be accomplished using a thermally conductive layer 138, which may comprise a monolayer of graphene in some embodiments.

The functionality provided by graphene can enhance the thermal conduction between the plate 102 and the insert to which it is mounted. The combination of the plate 102 and the thermally conductive layer 138 provide a direct heat sink path that permits the component 130 to dissipate heat that might otherwise degrade performance (e.g., as part of operation in high-temperature downhole conditions). The combination of the inset portion 118, post 110, and the thermally conductive layer 138 conveys a considerable advantage over conventional component post mounting schemes because component reliability is enhanced in two ways simultaneously: resistance to vibration damage is improved, along with resistance to damage from overheating.

Figure 2:
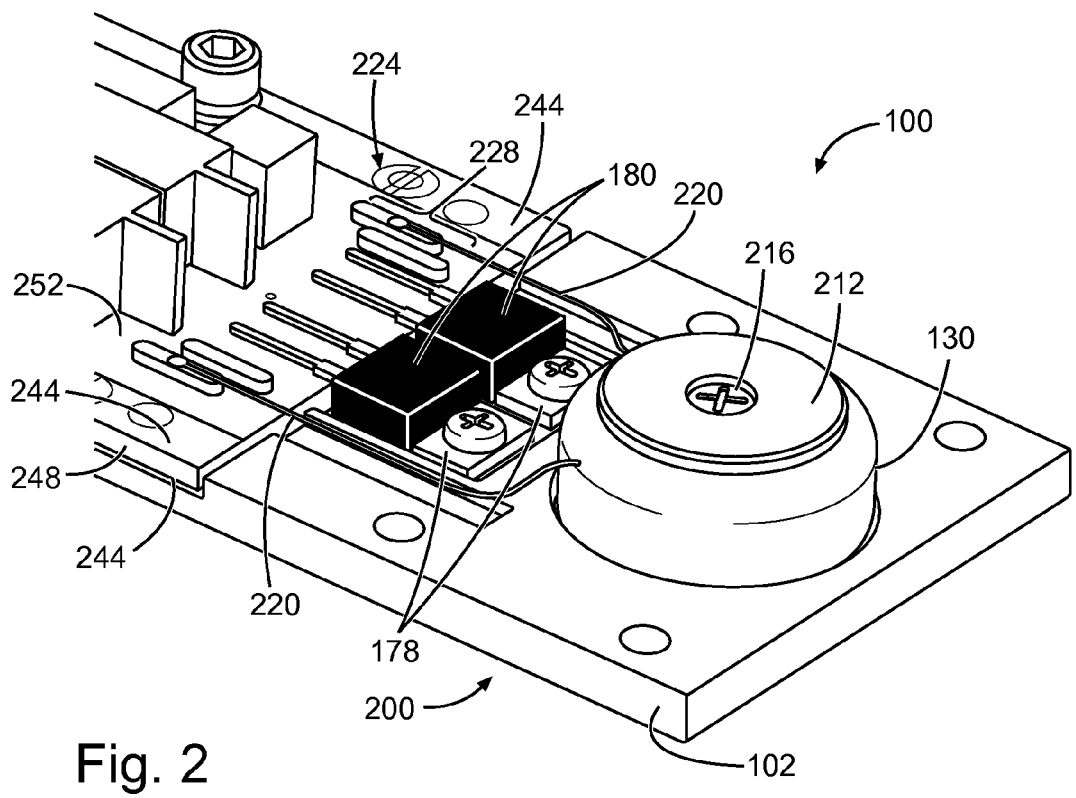
FIG. 2 is a perspective view of a circuit board assembly, including the apparatus shown in FIG. 1, according to various embodiments.

FIG. 2 is a perspective view of a circuit board assembly 200, including the apparatus 100 shown in FIG. 1, according to various embodiments. In some embodiments, the mounting plate 102 comprises type 17-4 steel, such as type 17-4PH steel (a martensitic precipitation-hardening stainless steel), or some other material, to match the thermal expansion characteristics of the insert (not shown) to which it is attached.

Here the circuit board assembly 200 is shown to include the plate 102 attached to the component 130, as described previously (the cap 212 and screw 216 are shown securing the component 130, but the cushion 134 cannot be seen in this figure). Wires 220 running from the component 130 to the circuit board 224 are shown attached to the terminals 228.

The mounting plate 102 design permits the use of larger electrical components 130 than might otherwise be possible, due to size and heat sinking requirements that meet the energy needs of the associated downhole tool. Insert mounting space is also used more efficiently, reducing the size of associated downhole tools, because a shorter collar can be used, or the extra space can be used for another function. Thus, many embodiments can be realized.

For example, referring now to FIGS. 1-2, it can be seen that in some embodiments, the apparatus 100 comprises a mounting plate 102 with two inset portions 108, 118, and one or more posts 110 that are used to secure an electronic component 130 to the plate 130. That is, the apparatus 100 comprises a substantially flat mounting plate 102 having a first inset portion 108 to receive a circuit board 224, and a second inset portion 118 to receive an electronic component 130. The second inset portion 118 may define a first end 142 of a post 110 extending in a vertical direction (e.g., along the axial direction 126) away from the horizontal plane of the mounting plate 102 to terminate in a second end 146, which may be shaped to receive a fastener.

In some embodiments, the first inset portion 108, which can be used to attach the plate 102 to a circuit board 224, may be defined by a stepped transition 150. A stepped transition 150 in many embodiments may comprise a perpendicular transition. In other embodiments, the stepped transition 150 may be defined by an angle θ formed between the intersection of the wall 154 and the floor 158 of the inset portion 108. The angle θ may be less than 90 degrees, greater than 90 degrees, or substantially equal to 90 degrees (i.e., in the case of a perpendicular transition). Thus, the first inset portion 108 may include at least one substantially straight wall 154 defining a stepped transition 150 from an upper level 162 of the plate 102, to a lower level of the first inset portion 108 (e.g., the floor 158), wherein the lower level (e.g., the floor 158) has a lower elevation than the upper level 162.

In some embodiments, the second inset portion 118, which can be used to attach one or more electronic components 130 to the plate 102, may be defined by a stepped transition 166, or a curved transition 166. The height of the lower elevation (e.g., the floor 114) of the second inset portion 118 can be independent of the height of the floor 158 first inset portion 108, the same as the height of the floor 158 of the first inset portion 108, or related in direct or inverse proportion to the height of the floor 158 of the first inset portion 108. In some embodiments, there may be multiple second inset portions 118, each of which has one or more posts 110 to secure components 130 to the plate 102. The post(s) 110 may be attached to the floor 114 of the second inset portion 118 as an integral part (e.g., molded or machined), or separately, such as coupling an internally-threaded end of the post 110 to the floor 114 with a threaded rod that is attached to the floor 114.

For example, the second inset portion 118 may comprise a substantially circular wall 160 defining a curved transition 166 from an upper level 162 of the plate 102, to a lower level (e.g., the floor 114) of the second inset portion 118, wherein the lower level (e.g., the floor 114) has a lower elevation than the upper level 162.

In some embodiments, graphite may be applied to the mounting plate 102, perhaps as a coating. Thus, the apparatus 100 may comprise a layer 138 of graphite attached to at least one surface of the plate 102. The graphite may be applied as a monolayer, such as graphene, so that the graphite comprises graphene.

In some embodiments, one or more caps and fasteners are used in combination with one or more posts to secure one or more electronic components to the plate. Thus, the apparatus 100 may comprise a cap 212 and a fastener 216 to secure the cap 212 to the plate 102 via the second end 146 of the post 110. The fastener 216 may have threads, such as those used to mate with a screw, or a threaded rod. Thus, the fastener 216 may comprise a threaded fastener.

In some embodiments, the apparatus 100 includes a circuit board 224. Thus, the apparatus 100 may comprise a circuit board 224 disposed in the first inset portion 108.

In some embodiments, the circuit board 224 may include thermally conductive structural elements 244, such as metallic traces coupled to a thermally conductive core 248, or a thermally conductive coating 252. Thus, the apparatus 100 may have a circuit board 224 that comprises at least one thermally conductive structural element 244 contacting a surface (e.g., floor 158) of the mounting plate 102, to enable conduction of heat from the circuit board 224 to the mounting plate 102.

Additional inset portions 174, 176 may be formed in the plate 102. These can be used to accommodate wires or heat sinks attached to electronic components 130, for example. Thus, the apparatus 100 may comprise additional inset portions 174, 176 formed as a wire inlay channel (e.g., inset portions 176) or a heat sink inlay channel (e.g., inset portion 174) in the mounting plate 102, wherein the wire inlay channel is to receive wires coupled to the electronic component 130, and wherein the heat sink inlay channel is to receive one or more heat sinks 178 attached to components 180 on the circuit board 224.

Electronic components 130 mounted to the plate may comprise any number of types of components, such as transistors, integrated circuits, and one or more coils. Thus, the apparatus 100 may comprise one or more electronic components 130 comprising coils disposed in one or more second inset portions 118, respectively. These coils may be formed as a toroid, such that they form part of a toroidal structure.

The apparatus 100 may include a cushion 134 element, such as a polymer, including an elastomer polymer (e.g., rubber), or some other material. Thus the apparatus 100 may comprise a cushion 134 disposed in a space extending horizontally between the toroidal structure of a coil (as the electronic element 130) and the post 110.

In some embodiments, the cushion 134 comprises silicone. The cushion 134 may therefore comprise a mixture of silicone and a curative, such as the RTV silicone rubber compound available from Momentive Performance Materials, Inc. of Waterford, N.Y. in the United States.

In some embodiments, the first inset portion 108 is formed as a bifurcated structure (e.g., see specifically FIG. 1), to support the sides of a circuit board 224, and provide access to both edges of a circuit board 224 that is attached to the plate 102. Thus, the apparatus 100 may include a first inset portion 108 that is divided into two legs 184 extending horizontally away from the second inset portion 118.

Applications that may include the novel apparatus and systems of various embodiments include electronic circuitry used in high-speed computers, communication and signal processing circuitry, modems, processor modules, embedded processors, data switches, and application-specific modules. Such apparatus and systems may further be included as sub-components within a variety of electronic systems, such as televisions, cellular telephones, personal computers, workstations, radios, video players, vehicles, and signal telemetry propagation circuits for downhole tools, among others. Some embodiments include a number of methods.

Figure 3:
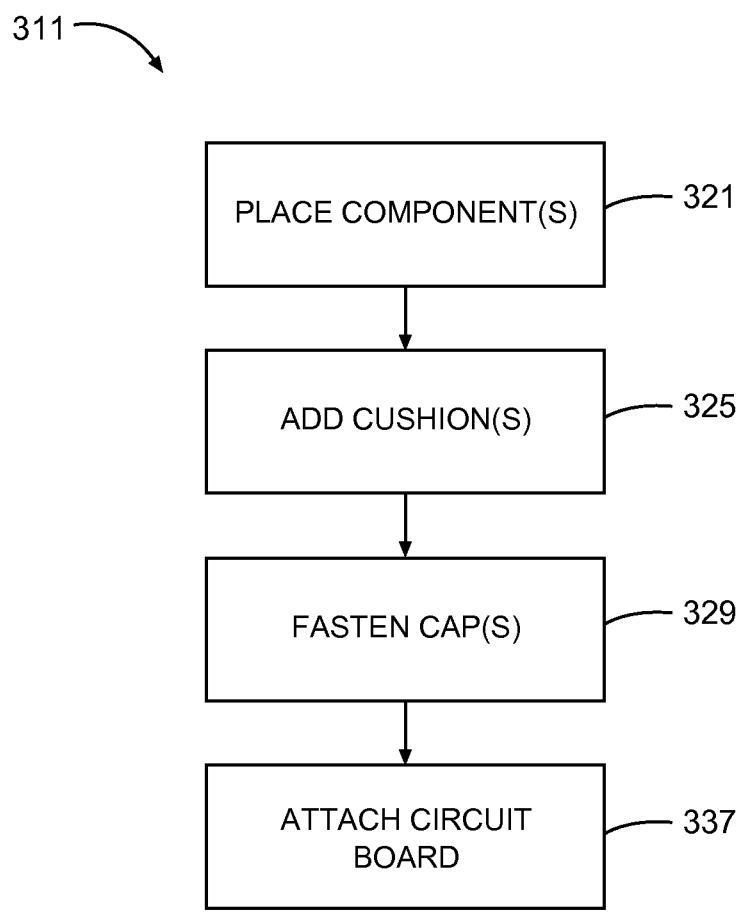
FIG. 3 is a flow diagram of manufacturing methods, according to various embodiments.

For example, FIG. 3 is a flow diagram of manufacturing methods 311, according to various embodiments. The methods 311 may comprise processor-implemented methods (e.g., perhaps executed by robots), to execute on one or more processors that perform the methods. The methods 311 may be applied to a number of configurations of the apparatus 100 and assembly 200 shown in FIGS. 1-2. For example, in some embodiments, a method 311 includes the acts of placing one or more electronic components in one or more inset portions of the mounting plate at block 321, adding a cushion between each component and the plate at block 325, and fastening caps to the posts on the mounting plate at block 329 to secure each component to the plate.

Thus, in some embodiments, the method 311 may comprise, at block 321, placing an electronic component into a second inset portion of a substantially flat mounting plate comprising a first inset portion and the second inset portion, wherein the second inset portion is attached to a first end of a post passing through an aperture of the electronic component, and wherein a second end of the post is shaped to receive a fastener. As noted previously, the electronic component may comprise a coil. However, many other component types may be used.

The method 311 may continue on to block 325 to include adding a cushion to at least partially fill a space defined by the electronic component and the post. As noted previously, the cushion may comprise a mixture of silicone and a curative. Thus the activity at block 325 may comprise adding a mixture of silicone and a curative.

The method 311, in some embodiments, may conclude at block 329 with fastening a cap to the post to secure the electronic component to the mounting plate.

In some embodiments, the method 311 may include attaching a circuit board to the mounting plate. Thus, the method 311 may comprise, at block 337, attaching a circuit board to the mounting plate, wherein the circuit board is disposed in the first inset portion.

It should be noted that the methods described herein do not have to be executed in the order described, or in any particular order. Moreover, various activities described with respect to the methods identified herein can be executed in iterative, serial, or parallel fashion. The various elements of each method (e.g., the methods shown in FIG. 3) can be substituted, one for another, within and between methods. Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. For example, the programs may be structured in an object-orientated format using an object-oriented language such as Java or C#. In another example, the programs can be structured in a procedure-orientated format using a procedural language, such as assembly or C. The software components may communicate using any of a number of mechanisms well known to those of ordinary skill in the art, such as application program interfaces or interprocess communication techniques, including remote procedure calls. The teachings of various embodiments are not limited to any particular programming language or environment. Thus, other embodiments may be realized.

Figure 4:
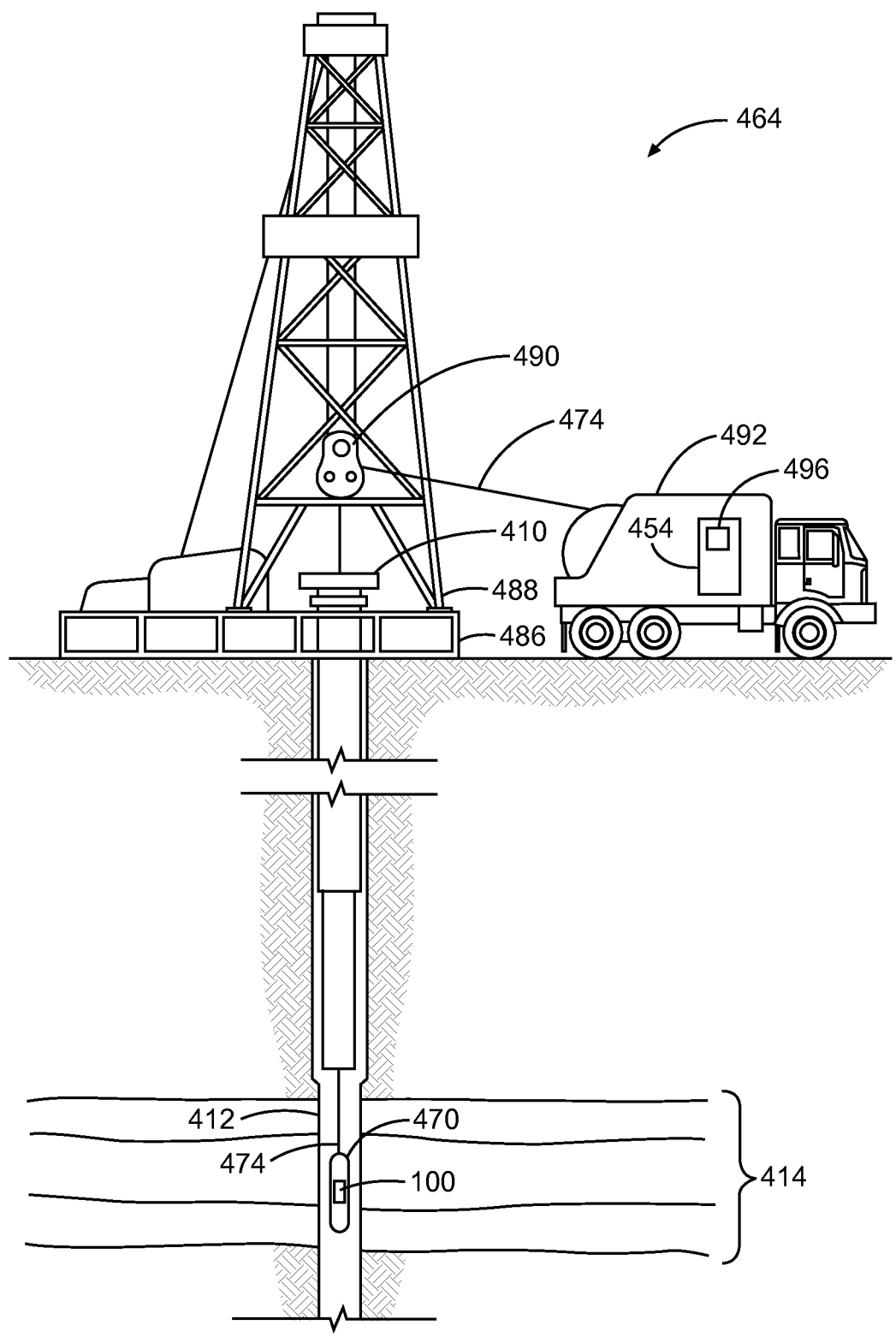
FIG. 4 is a diagram of a wireline system, according to various embodiments.
Figure 5:
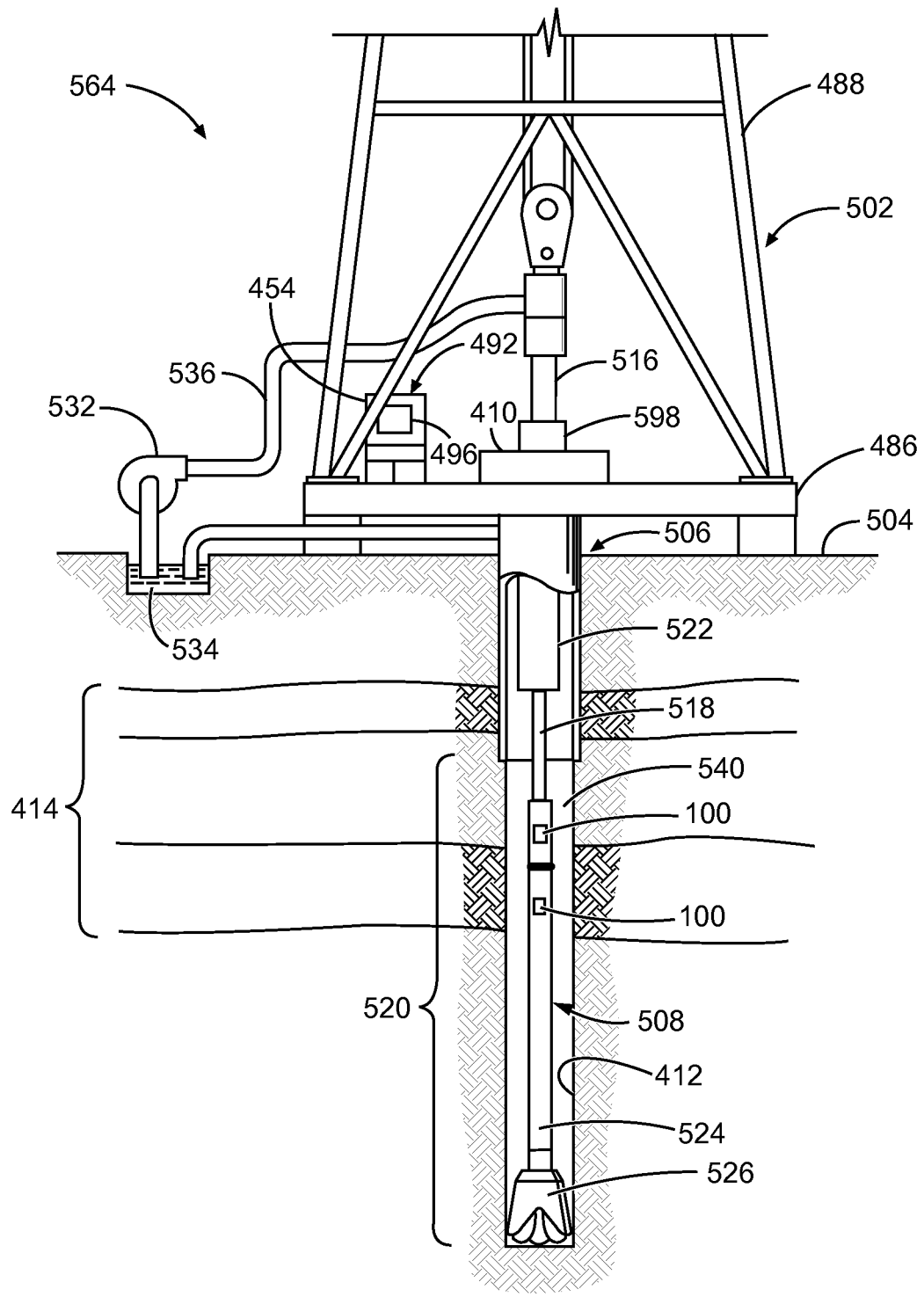
FIG. 5 is a diagram of a drilling rig system, according to various embodiments.

For example, FIG. 4 is a diagram of a wireline system 464, according to various embodiments. FIG. 5 is a diagram of a drilling rig system 564, according to various embodiments. Therefore, the systems 464, 564 may comprise portions of a wireline logging tool body 470 as part of a wireline logging operation, or of a downhole tool 524 as part of a downhole drilling operation. The systems 464 and 564 may include any one or more elements of the apparatus 100 shown in FIGS. 1-2.

Thus, FIG. 4 shows a well during wireline logging operations. In this case, a drilling platform 486 is equipped with a derrick 488 that supports a hoist 490.

Drilling oil and gas wells is commonly carried out using a string of drill pipes connected together so as to form a drilling string that is lowered through a rotary table 410 into a wellbore or borehole 412. Here it is assumed that the drilling string has been temporarily removed from the borehole 412 to allow a wireline logging tool body 470, such as a probe or sonde, to be lowered by wireline or logging cable 474 into the borehole 412. Typically, the wireline logging tool body 470 is lowered to the bottom of the region of interest and subsequently pulled upward at a substantially constant speed.

During the upward trip, at a series of depths, various instruments included in the tool body 470 may be used to perform measurements and transmit data (e.g., data transmitted by a mud pulse driver assembly that includes the apparatus 100 shown in FIGS. 1-2) concerning the constitution of subsurface geological formations 414 adjacent the borehole 412 (and the tool body 470). The borehole 412 may represent one or more offset wells, or a target well.

The measurement data can be communicated to a surface logging facility 492 for processing, analysis, and/or storage. The logging facility 492 may be provided with electronic equipment for various types of signal processing. Similar formation evaluation data may be gathered, communicated, and analyzed during drilling operations (e.g., during logging while drilling operations, and by extension, sampling while drilling).

In some embodiments, the tool body 470 is suspended in the wellbore by a wireline cable 474 that connects the tool to a surface control unit (e.g., comprising a workstation 454). The tool may be deployed in the borehole 412 on coiled tubing, jointed drill pipe, hard wired drill pipe, or any other suitable deployment technique.

Turning now to FIG. 5, it can be seen how a system 564 may also form a portion of a drilling rig 502 located at the surface 504 of a well 506. The drilling rig 502 may provide support for a drill string 508. The drill string 508 may operate to penetrate the rotary table 410 for drilling the borehole 412 through the subsurface formations 414. The drill string 508 may include a Kelly 516, drill pipe 518, and a bottom hole assembly 520, perhaps located at the lower portion of the drill pipe 518.

The bottom hole assembly 520 may include drill collars 522, a downhole tool 524, and a drill bit 526. The drill bit 526 may operate to create the borehole 412 by penetrating the surface 504 and the subsurface formations 414. The downhole tool 524 may comprise any of a number of different types of tools including measurement while drilling tools, logging while drilling tools, and others.

During drilling operations, the drill string 508 (perhaps including the Kelly 516, the drill pipe 518, and the bottom hole assembly 520) may be rotated by the rotary table 410. Although not shown, in addition to, or alternatively, the bottom hole assembly 520 may also be rotated by a motor (e.g., a mud motor) that is located downhole. The drill collars 522 may be used to add weight to the drill bit 526. The drill collars 522 may also operate to stiffen the bottom hole assembly 520, allowing the bottom hole assembly 520 to transfer the added weight to the drill bit 526, and in turn, to assist the drill bit 526 in penetrating the surface 504 and subsurface formations 414.

During drilling operations, a mud pump 532 may pump drilling fluid (sometimes known by those of ordinary skill in the art as "drilling mud") from a mud pit 534 through a hose 536 into the drill pipe 518 and down to the drill bit 526. The drilling fluid can flow out from the drill bit 526 and be returned to the surface 504 through an annular area between the drill pipe 518 and the sides of the borehole 412. The drilling fluid may then be returned to the mud pit 534, where such fluid is filtered. In some embodiments, the drilling fluid can be used to cool the drill bit 526, as well as to provide lubrication for the drill bit 526 during drilling operations. Additionally, the drilling fluid may be used to remove subsurface formation cuttings created by operating the drill bit 526.

Thus, referring now to FIGS. 1-2 and 4-5, it may be seen that in some embodiments, the systems 464, 564 may include a drill collar 522, a downhole tool 524, and/or a wireline logging tool body 470 to house one or more apparatus 100, similar to or identical to the apparatus 100 described above and illustrated in FIGS. 1-2.

The tool 524 may comprise a downhole tool, such as a logging while drilling (LWD) tool or a measurement while drilling (MWD) tool. The wireline tool body 470 may comprise a wireline logging tool, including a probe or sonde, for example, coupled to a logging cable 474. Many embodiments may thus be realized.

For example a system 464, 564 may include a downhole tool housing attached to the mounting plate apparatus 100. That is, a system 464, 565 may comprise a downhole tool housing (e.g., taking the form of a wireline tool (e.g., sonde 470), or a drill string tool, perhaps using a collar 522, a downhole tool 524, or a bottom hole assembly 520 as a housing) and one or more apparatus 100 attached to the housing, the apparatus 100 comprising any one or more of the configurations described previously.

The circuit card attached the mounting plate in the apparatus 100 may comprise a number of circuits, including one or more portions of a mud pulse telemetry driver assembly, and beneficially, other relatively high-powered driver circuits, as those of ordinary skill in the art will realize after reading this disclosure document.

The apparatus 100; circuit board 224, systems 464, 564; rotary table 410; borehole 412; computer workstations 454; wireline logging tool body 470; drilling platform 486; derrick 488; hoist 490; logging facility 492; display 496; drill string 508; Kelly 516; drill pipe 518; bottom hole assembly 520; drill collars 522; downhole tool 524; drill bit 526; mud pump 532; mud pit 534; and hose 536 may all be characterized as "modules" herein.

Such modules may include hardware circuitry, and/or a processor and/or memory circuits, software program modules and objects, and/or firmware, and combinations thereof, as desired by the architect of the apparatus 100 and systems 464, 564 and as appropriate for particular implementations of various embodiments. For example, in some embodiments, such modules may be included in an apparatus and/or system operation simulation package, such as a software electrical signal simulation package, a power usage and distribution simulation package, a power/heat dissipation simulation package, a vibration simulation package, and/or a combination of software and hardware used to simulate the operation of various potential embodiments.

It should also be understood that the apparatus and systems of various embodiments can be used in applications other than for logging operations, and thus, various embodiments are not to be so limited. The illustrations of apparatus 100 and systems 464, 564 are intended to provide a general understanding of the structure of various embodiments, and they are not intended to serve as a complete description of all the elements and features of apparatus and systems that might make use of the structures described herein.

Thus, many embodiments may be realized. For example, an apparatus may comprise a substantially flat mounting plate having a first inset portion to receive a circuit board, and a second inset portion to receive an electronic component, wherein a lower level of the second inset portion defines a first end of a post extending in a vertical direction away from the mounting plate to terminate in a second end, and wherein the second end of the post is shaped to receive a fastener.

The apparatus may comprise any number of circuit assemblies, such as telemetry driver assemblies, including a portion of a mud pulse telemetry driver assembly. A thermally conductive layer, such as a layer of graphite, which may comprise graphene, may be attached to one or more surfaces of the plate.

The first inset portion includes at least one substantially straight wall defining a stepped transition from an upper level of the plate, to the lower level of the first inset portion, wherein the lower level has a lower elevation than the upper level. The first inset portion may be divided into two legs extending horizontally away from the second inset portion.

The second inset portion may comprise a substantially circular wall defining a curved transition from an upper level of the plate, to a lower level of the second inset portion, wherein the lower level of the second inset portion has a lower elevation than the upper level. One or more posts may be attached to the lower level of the second inset portion as an integral part (e.g., molded or machined), or separately, such as coupling an internally-threaded end of the post to the lower level of the second inset portion with a threaded rod that is attached to the lower level of the second inset portion.

The apparatus may further comprise a circuit board disposed in the first inset portion. The circuit board may comprise one or more thermally conductive structural elements contacting a surface of the mounting plate, to enable conduction of heat from the circuit board to the mounting plate.

The apparatus may further comprise a third inset portion formed as a wire inlay channel or a heat sink inlay channel in the mounting plate. The wire inlay channel may be formed to receive wires coupled to the electronic component. The heat sink inlay channel may be formed to receive one or more heat sinks attached to components on the circuit board.

The electronic component disposed in the second inset portion may comprise any number of components, such as a transistor, a capacitor, or coil. The apparatus may further comprise a cushion (which may comprise rubber, such as silicone) disposed in a space extending horizontally between the electronic component, such as the coil, which may comprise a toroidal structure, and the post. The apparatus may further comprise a cap and a fastener to secure the cap to the plate via the second end of the post. The electronic component may be partially or wholly disposed between the cap and the plate. The fastener may comprise a threaded fastener, such as a screw or threaded rod.

A system may comprise a downhole tool housing attached to any one or more forms of the apparatus described previously. The downhole tool housing may comprise one of a drill string tool or a wireline tool, among others.

A method may comprise placing an electronic component into a second inset portion of a substantially flat mounting plate comprising a first inset portion and the second inset portion, wherein the second inset portion is attached to a first end of a post passing through an aperture of the electronic component, and wherein a second end of the post is shaped to receive a fastener. The electronic component may comprise a coil, a transistor, or other device.

The method may further comprise adding a cushion to at least partially fill a space defined by the electronic component and the post, and fastening a cap to the post to secure the electronic component to the mounting plate. Adding the cushion may comprise adding a mixture of silicone and a curative to at least partially fill the space defined by the electronic component and the post.

The method may further comprise attaching a circuit board to the mounting plate, wherein the circuit board is disposed in the first inset portion. The board may be attached to the plate via screws, rivets, adhesive, and/or solder, among others.

In summary, the apparatus, systems, and methods disclosed herein provide a mechanism that can be used to improve the reliability of circuit components subjected to the elevated vibration and temperature conditions that are often found downhole. As a result of experiencing operations that are less often impeded by equipment breakdown due to the typically harsh environment, the value of services provided by a downhole operation/exploration company may be significantly enhanced.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of ordinary skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus, comprising:
    a flat mounting plate having a first inset portion to receive a circuit board, and a second inset portion to receive an electronic component, wherein a lower level of the second inset portion defines a first end of a post extending in a vertical direction away from the mounting plate to terminate in a second end, and wherein the second end of the post is shaped to receive a fastener.

2. The apparatus of claim 1, wherein the first inset portion includes at least one straight wall defining a stepped transition from an upper level of the mounting plate, to a lower level of the first inset portion, wherein the lower level of the first inset portion has a lower elevation than the upper level of the mounting plate.

3. The apparatus of claim 1, wherein the second inset portion comprises a circular wall defining a curved transition from an upper level of the mounting plate, to a lower level of the second inset portion, wherein the lower level of the second inset portion has a lower elevation than the upper level of the mounting plate.

4. The apparatus of claim 1, further comprising:
    a layer of graphite attached to at least one surface of the mounting plate.

5. The apparatus of claim 4, wherein the graphite comprises graphene.

6. The apparatus of claim 1, further comprising:
    a cap; and
    a fastener to secure the cap to the mounting plate via the second end of the post.

7. The apparatus of claim 6, wherein the fastener comprises a threaded fastener.

8. The apparatus of claim 1, further comprising:
    a circuit board disposed in the first inset portion.

9. The apparatus of claim 8, wherein the circuit board comprises at least one thermally conductive structural element contacting a surface of the mounting plate, to enable conduction of heat from the circuit board to the mounting plate.

10. The apparatus of claim 8, further comprising:
a third inset portion formed as a wire inlay channel or a heat sink inlay channel in the mounting plate, wherein the wire inlay channel is to receive wires coupled to the electronic component, and wherein the heat sink inlay channel is to receive one or more heat sinks attached to components on the circuit board.

11. The apparatus of claim 1, wherein the electronic component comprises:
a coil disposed in the second inset portion.

12. The apparatus of claim 11, wherein the coil forms part of a toroidal structure.

13. The apparatus of claim 12, further comprising:
a cushion disposed in a space extending horizontally between the toroidal structure and the post.

14. The apparatus of claim 3, wherein the cushion comprises silicone.

15. The apparatus of claim 1, wherein the first inset portion is divided into two legs extending horizontally away from the second inset portion.

16. A system, comprising:
a downhole tool housing; and
an apparatus attached to the housing, the apparatus comprising a flat mounting plate having a first inset portion to received a circuit board, and a second inset portion to receive an electronic component, wherein a lower level of the second inset portion defines a first end of a post, and wherein a second end of the post is shaped to receive a fastener.

17. The system of claim 16, wherein the downhole tool housing comprises one of a drill string tool or a wireline tool.

18. The system of claim 16, wherein the apparatus comprises a portion of a mud pulse telemetry driver assembly.

19. A method, comprising:
placing an electronic component into a second inset portion of a flat mounting plate comprising a first inset portion to receive a circuit board and the second inset portion, wherein the second inset port on is attached to a first end of a post passing through an aperture of the electronic component, and wherein a second end of the post is shaped to receive a fastener;
adding a cushion to at least partially fill a space defined by the electronic component and the post; and
fastening a cap to the post to secure the electronic component to the mounting plate.

20. The method of claim 19, wherein adding the cushion comprises adding a mixture of silicone and a curative.

21. The method of claim 19, further comprising:
attaching a circuit board to the mounting plate, wherein the circuit board is disposed in the first inset portion.

22. The method of claim 19, wherein the electronic component comprises a coil.

\* \* \* \* \*